US012656304B2

(12) United States Patent
He et al.

(10) Patent No.: US 12,656,304 B2
(45) Date of Patent: Jun. 16, 2026

(54) GAS SENSOR BASED ON THIOPHENE-BASED HIGH PERFORMANCE ORGANIC SEMICONDUCTING MATERIALS WITH LARGE SURFACE AREA VERTICAL DEVICE DESIGN

(71) Applicants: Corning Incorporated, Corning, NY (US); National Yang Ming Chiao Tung University, Hsin-Chu (TW)

(72) Inventors: Mingqian He, Horseheads, NY (US); Yang Li, Shanghai (CN); Hung-Chuan Liu, Changhua (CN); Karan Mehrotra, Painted Post, NY (US); Hsin-Fei Meng, Hsinchu (TW); Hsiao-Wen Zan, Hsinchu (TW)

(73) Assignees: CORNING INCORPORATED, Corning, NY (US); NATIONAL YANG MING CHIAO TUNG UNIVERSITY, Hsin-Chu (TW)

( * ) Notice: Subject to any disclaimer, the term of this patent is extended or adjusted under 35 U.S.C. 154(b) by 1497 days.

(21) Appl. No.: 16/703,124

(22) Filed: Dec. 4, 2019

(65) Prior Publication Data

US 2020/0217816 A1 Jul. 9, 2020

(30) Foreign Application Priority Data

Dec. 5, 2018 (CN) ........................ 201811480710.3

(51) Int. Cl.

| | |
|---|---|
| ***G01N 27/414*** | (2006.01) |
| ***H10K 10/46*** | (2023.01) |
| ***H10K 85/10*** | (2023.01) |

(52) U.S. Cl.
CPC ....... *G01N 27/4141* (2013.01); *H10K 10/484* (2023.02); *H10K 85/113* (2023.02)

(58) Field of Classification Search
CPC ............. G01N 27/4141; G01N 27/307; G01N 27/129; H01L 51/0558; H01L 51/0036;
(Continued)

(56) References Cited

U.S. PATENT DOCUMENTS

| | | | |
|---|---|---|---|
| 7,705,108 | B2 | 4/2010 | He |
| 7,838,623 | B2 | 11/2010 | He |

(Continued)

FOREIGN PATENT DOCUMENTS

| | | | |
|---|---|---|---|
| TW | I427288 | B | 2/2014 |
| TW | I565532 | B | 1/2017 |

(Continued)

OTHER PUBLICATIONS

Rajeev et al., Ammonia gas detection using field-effect transistor based on solution-processable organic semiconductor, Vacuum, 2018, 158, 271-277 (Available on Oct. 10, 2018) (Year: 2018).*

(Continued)

*Primary Examiner* — Shizhi Qian
(74) *Attorney, Agent, or Firm* — Travis B. Gasa

(57) ABSTRACT

Described herein are ultrasensitive gas sensors based on a vertical-channel organic semiconductor (OSC) diode, along with methods for making such devices, and uses thereof. The organic sensing layer comprises a fused thiophene-based organic polymer that connects top and bottom electrodes to deliver a vertical current flow. The nano-porous top-electrode structure enables the contact between ambient gas molecules and the vertical organic channel. The device has high sensitivity, is easy to process, and has a long shelf life.

20 Claims, 8 Drawing Sheets

(58) Field of Classification Search
CPC ............. H01L 51/0035; H01L 51/0043; H01L 51/055; H01L 51/057; C08G 61/124; C08G 61/126; C08G 2261/124; C08G 2261/1412; C08G 2261/3223; C08G 2261/334; C08G 2261/514; C08G 2261/94
See application file for complete search history.

(56) References Cited

U.S. PATENT DOCUMENTS

| | | | | |
|---|---|---|---|---|
| 7,893,191 | B2 | 2/2011 | He | |
| 8,389,669 | B2 | 3/2013 | He | |
| 8,624,232 | B2 | 1/2014 | Sonar et al. | |
| 8,723,503 | B2 | 5/2014 | Zan et al. | |
| 8,748,221 | B2 | 6/2014 | Meng et al. | |
| 8,877,535 | B2 | 11/2014 | Zan et al. | |
| 2012/0035375 | A1* | 2/2012 | He | C08G 61/126 549/3 |
| 2013/0109821 | A1 | 5/2013 | He et al. | |
| 2013/0140540 | A1* | 6/2013 | He | H01L 51/0001 257/40 |
| 2016/0222167 | A1* | 8/2016 | He | C08G 61/123 |
| 2016/0268525 | A1* | 9/2016 | Bellman | H01L 51/052 |
| 2017/0331045 | A1* | 11/2017 | Chung | C08L 53/00 |

FOREIGN PATENT DOCUMENTS

| | | | |
|---|---|---|---|
| TW | I565650 | B | 1/2017 |
| TW | I574005 | B | 3/2017 |
| TW | I577991 | B | 4/2017 |
| TW | I597496 | B | 9/2017 |
| WO | 2016123286 | A1 | 8/2016 |

OTHER PUBLICATIONS

Nketia-Yawson et al., Organic thin film transistor with conjugated polymers for highly sensitive gas sensors, Macromolecular Research, 2017, 25, 489-495 (Year: 2017).*
Chuang et al., Modulated gas sensor based on vertical organic diode with blended channel for ppb-regime detection, Sensors and Actuators B: Chemical, 2016, 230, 223-230 (Year: 2016).*
A Breath Ammonia Analyser for Monitoring Patients With End-Stage Renal Disease on Haemodialysis "; British Journal of Biomedical Science; 74:1; pp. 24-29".
Chang et al; "One-Minute Fish Freshness Evaluation by Testing the Volatile Amine Gas With an Ultrasensitive Porous-Electrode-Capped Orgainc Gas Sensor System"; ACS Sens.; 2; pp. 531-539 (2017.
Chao et al; "High-Performance Solution-Processed Polymer Space-Charge-Limited Transistor"; Organic Electronics, 9 (2008) pp. 310-316.
Chao et al; "Polymer Space-Charge-Limited Transistor"; Applied Physics Letters, 88 pp. 223510-1 to 223510-3, (2006.
Chen et al; "Biochemical Pathways of Breath Ammonia (NH3) Generation in Patients With End Stage Renal Disease Undergoing Hemodialysis"; J. Breath Res. 10 (2016) 036011; 11 Pages.
Dai et al; "Highly Sensitive Ammonia Sensor With Organic Vertical Nanojunctions for Noninvasive Detection of Hepatic Injury"; Anal. Chem. ;(2013), 85 pp. 3110-3117.
Davies et al; "Quantitative Analysis of Ammonia on the Breath of Patients in End-Stage Renal Failure"; Kidney International, vol. 52 (1997) pp. 223-228.
Endre et al; "Breath Ammonia and Trimethylamine Allow Real-Time Monitoring of Haemodialysis Efficacy"; Physiol. Meas.; 32 115-130 (2011).
Hibbard et al; "Point of Care Monitoring of Hemodialysis Patients With a Breath Ammonia Measurement Device Based on Printed Polyaniline Nanoparticle Sensors"; Anal. Chem. (2013), 85 pp. 12158-12165.
Narasimhan et al; "Correlation of Breath Ammonia With Blood Urea Nitrogen and Creatinine During Hemodialysis"; PNAS, vol. 98, No. 8, (2001) pp. 4617-4621.
Natale et al; "Solid-State Gas Sensors for Breath Analysis: A Review"; Analytica Chimica Acta, 824 (2014) pp. 1-17.
Neri et al; "Real-Time Monitoring of Breath Ammonia During Haemodialysis: Use of Ion Mobility Spectrometry (IMS) and Cavity Ring-Down Spectroscopy (CRDS) Techniques"; Nephrol Dial Transplant (2012) 27: pp. 2945-2952.
Popa et al; "Ethylene and Ammonia Traces Measurements From the Patients' Breath With Renal Failure via LPAS Method"; Appl. Phys. B (2011) 105: pp. 669-674.
Righettoni et al; "Breath Analysis by Nanostructured Metal Oxides as Chemo-Resistive Gas Sensors"; Materials Today, vol. 18, No. 3 (2015); pp. 164-171.
International Search Report and Written Opinion of the European International Searching Authority; PCT/US2019/063218; Mailed Feb. 28, 20; 13 pgs.
Ming-Yen et al. "Modulated gas sensor based on vertical organic diode with blended channel for ppb-regime detection," Sensors and Actuators B: Chemical 230, 2016, pp. 224-229.
Zhang et al. "Solution-processed nanoporous organic semicoductor thin films: toward health and environmental monitoring of volatile markers," Advanced Functional Materials 27(23) 2017, pp. 1-9.

* cited by examiner

GAS SENSOR BASED ON THIOPHENE-BASED HIGH PERFORMANCE ORGANIC SEMICONDUCTING MATERIALS WITH LARGE SURFACE AREA VERTICAL DEVICE DESIGN

BACKGROUND

Field

This application claims the benefit of priority under 35 U.S.C. § 119 of Chinese Patent Application Serial No. 201811480710.3 filed on Dec. 5, 2018, the content of which is relied upon and incorporated herein by reference in its entirety.

Described herein are ultrasensitive gas sensors based on a vertical-channel organic semiconductor (OSC) diode, along with methods for making such devices, and uses thereof. The organic sensing layer comprises a fused thiophene-based organic polymer that connects top and bottom electrodes to deliver a vertical current flow. The nano-porous top-electrode structure enables the contact between ambient gas molecules and the vertical organic channel. The device has high sensitivity, is easy to process, and has a long shelf life. When gas molecules, such as the ammonia-containing compounds, reduce the OSC channel, the current is affected and a reversible signal output is obtained.

Technical Background

An explosion of interest in organic electronics has given rise to extensive research on organic semiconductor devices, especially in the area of medicine and medical devices. With improved sensitivity and increasingly smaller and less invasive devices, it is envisioned that detecting biomarkers will become increasingly more important in monitoring people's health. For example, if non-invasive detection of biomarkers can be done on a regular (e.g., daily) basis, it may help in preventive medicine or help improve treatment quality for patients suffering from chronic diseases.

One attractive way to obtain biomarkers non-invasively is to detect specific gas molecules in the exhaled breath of the patient. There have been a number of studies aimed at verifying the efficacy of using breath biomarkers to do disease identification or help in diagnosis. New organic semiconductor devices may improve such biomarker-based devices by making them cheaper, smaller, and/or more sensitive. For example, organic semiconductors are envisaged to substantially reduce the cost over more traditional devices because they can be deposited from solution, enabling fast, large-area fabrication routes such as spin-coating, ink-jet printing, gravure printing, transfer printing and other printing processes. Newly developed disposable organic-based products may be attached to patients and then easily recycled. Flexible organic electronics can more easily be applied to skin or other non-planar surfaces.

SUMMARY

Described herein are polymer compositions including heterocyclic organic compounds, such as fused thiophene compounds, methods for making them, and uses thereof. The compositions and methods described herein possess a number of advantages over prior art compositions and methods. For example, the substituted fused thiophene compositions described herein may be made to be more soluble and processable than the analogous unsubstituted thiophene compositions. Polymers and oligomers including the fused thiophene moieties described herein may be processable using conventional spin-coating operations. Further, the compositions described herein may be made with substantially no β-H content, greatly improving the oxidative stability of the compositions.

In an aspect (1), the disclosure provides an electronic sensing device comprising a substrate; a cathode; an anode positively biased relative to the cathode; an insulating layer; a semiconductor layer comprising an organic semiconductor polymer with the structure:

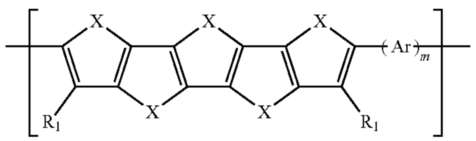

or

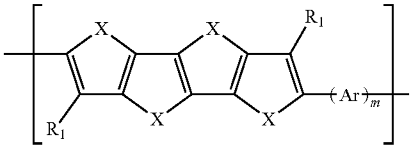

where each x is independently $NR_6$, S, Se, or O; each $R_1$ is independently hydrogen, $C_1$-$C_{40}$ alkyl, $C_1$-$C_{40}$ alkenyl, $C_1$-$C_{40}$ alkynl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo; each $R_5$ is independently hydrogen, $C_1$-$C_{40}$ alkyl, $C_1$-$C_{40}$ alkenyl, $C_1$-$C_{40}$ alkoxy, $C_1$-$C_{40}$ cycloalkyl, $C_1$-$C_{40}$ aryl, $C_1$-$C_{40}$ heteroaryl, or $C_1$-$C_{40}$ conjugated group, any of which may be optionally substituted; and each $R_6$ is independently hydrogen, $C_1$-$C_{40}$ alkyl, m is an integer from 1 to 10, and n is an integer from 2 to 10,000.

In an aspect (2), the disclosure provides the electronic sensing device of aspect (1), wherein each Ar is independently one of:

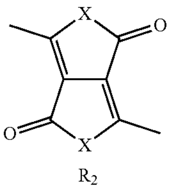

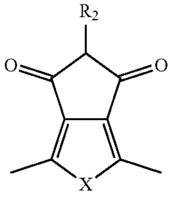

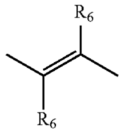

-continued

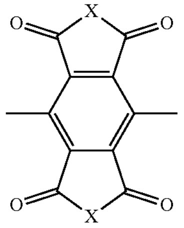

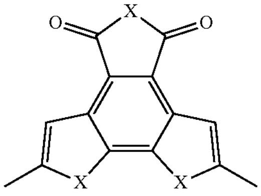

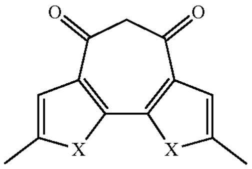

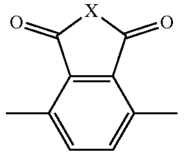

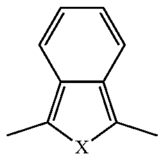

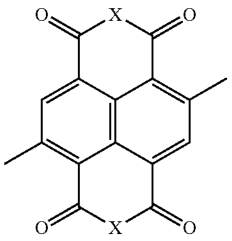

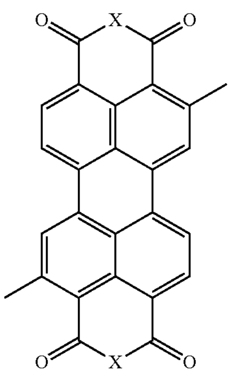

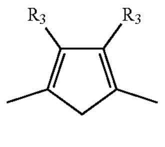

-continued

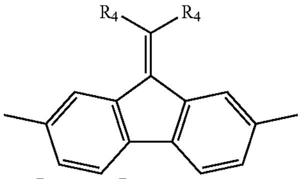

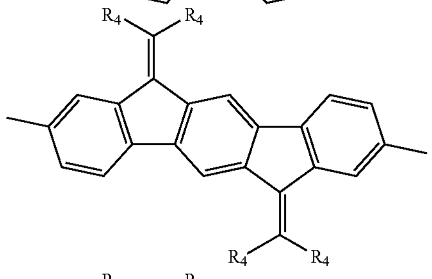

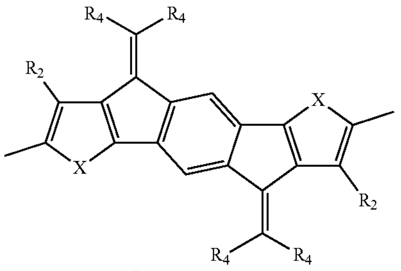

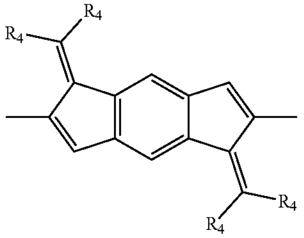

where each x is independently $NR_5$, S, Se, or O; each $R_2$ is independently hydrogen, $C_1$-$C_{40}$ alkyl, $C_1$-$C_{40}$ alkenyl, $C_1$-$C_{40}$ alkynl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo; each $R_3$ is independently hydrogen, $C_1$-$C_{40}$ alkyl, $C_1$-$C_{40}$ alkenyl, $C_1$-$C_{40}$ alkoxy, $C_1$-$C_{40}$ cycloalkyl, $C_1$-$C_{40}$ aryl, $C_1$-$C_{40}$ heteroaryl, or $C_1$-$C_{40}$ conjugated group, any of which may be optionally substituted; each $R_4$ is independently hydrogen, $C_1$-$C_{40}$ alkyl, cyano, ester, or carboxylic acid, and each $R_6$ is independently hydrogen, $C_1$-$C_{40}$ alkyl, cyano, ester, or carboxylic acid.

In an aspect (3), the disclosure provides the electronic sensing device of aspect (2), wherein one or more of $R_1$, $R_2$, $R_3$, $R_4$, and $R_6$ is an optionally substituted $C_{15}$-$C_{35}$ alkyl. In an aspect (4), the disclosure provides the electronic sensing device of aspect (3), wherein one or more of $R_1$, $R_2$, $R_3$, or $R_4$ is an optionally substituted $C_{15}$-$C_{35}$ alkyl having at least one branching point. In an aspect (5), the disclosure provides the electronic sensing device of aspect (4), wherein one or more of $R_1$, $R_2$, or $R_3$ can be optionally substituted $C_{15}$-$C_{35}$ alkyl. In an aspect (6), the disclosure provides the electronic sensing device of aspect (5), wherein each $R_1$ or $R_2$ is independently an optionally substituted $C_{15}$-$C_{35}$ alkyl. In an aspect (7), the disclosure provides the electronic sensing device of aspect (6), wherein each $R_1$ or $R_2$ is independently an optionally substituted $C_{15}$-$C_{35}$ alkyl having at least one branching point. In an aspect (8), the disclosure provides the electronic sensing device of aspect (7), wherein each $R_1$ or $R_2$ is independently an optionally substituted $C_{15}$-$C_{35}$ alkyl having at least one branching point, where the branching point is at least 4 carbons from the base molecule.

In an aspect (9), the disclosure provides the electronic sensing device of any of aspects (1)-(8), wherein the organic semiconductor polymer has the structure:

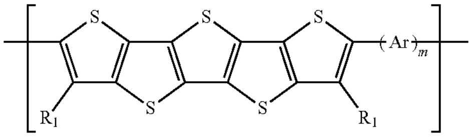

or

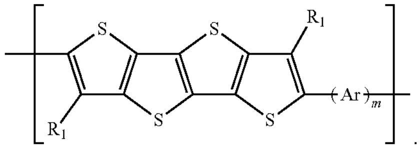

.

In an aspect (10), the disclosure provides the electronic sensing device of any of aspects (1)-(9), wherein at least one Ar is:

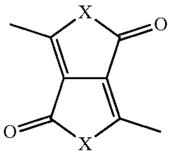

where each x is independently $NR_5$, S, Se, or O; each $R_5$ is independently hydrogen, $C_1$-$C_{40}$ alkyl.

In an aspect (11), the disclosure provides the electronic sensing device of any of aspects (1)-(10), wherein m is 1 and Ar is:

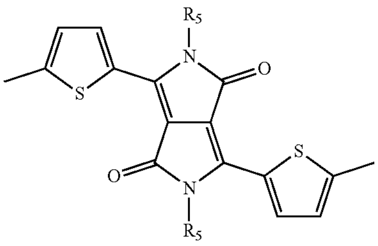

or

-continued

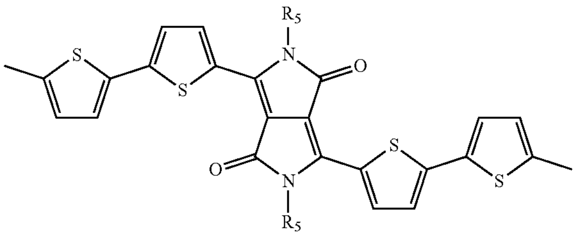

wherein each $R_5$ is independently hydrogen or $C_1$-$C_{40}$ alkyl.

In an aspect (12), the disclosure provides a method of detecting an airborne substance, the method comprising: applying an electric potential to create an electrical current in the sensing device of any of aspects (1)-(11); measuring a signal based on changes in the electrical current in the device; and outputting the signal. In an aspect (13), the disclosure provides the method of aspect (12), wherein changes in the electrical current in the device are based on adhesion of airborne molecules having a concentration to the organic semiconductor. In an aspect (14), the disclosure provides the method of aspect (13), wherein the concentration of the airborne molecules is from 1 ppb to 500 ppm. In an aspect (15), the disclosure provides the method of any of aspects (12)-(14), wherein the measuring a signal is an integrated measurement over a time 1 minute or less. In an aspect (16), the disclosure provides the method of any of aspects (12)-(15), wherein the airborne molecules comprising at least one amine group.

In some embodiments, an electronic sensing device comprises: a substrate; a cathode; an anode positively biased relative to the cathode; an insulating layer; and a semiconductor layer comprising an organic semiconductor polymer, wherein the semiconductor layer comprises a mixture of at least two organic semiconductor polymers, each having different molecular weights.

In one aspect, which is combinable with any of the other aspects or embodiments, the mixture of at least two organic semiconductor polymers comprises a first organic semiconductor polymer and a second organic semiconductor polymer.

In one aspect, which is combinable with any of the other aspects or embodiments, the first organic semiconductor polymer has a structure of:

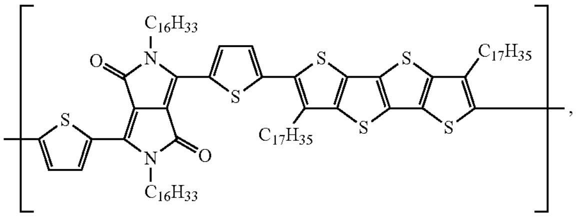

, and the second organic semiconductor polymer has a structure of:

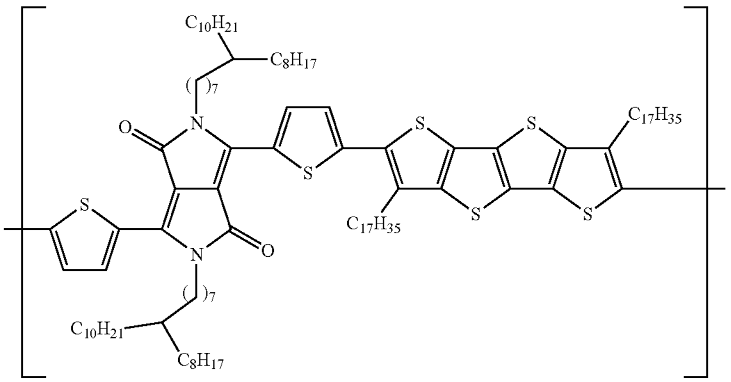

or

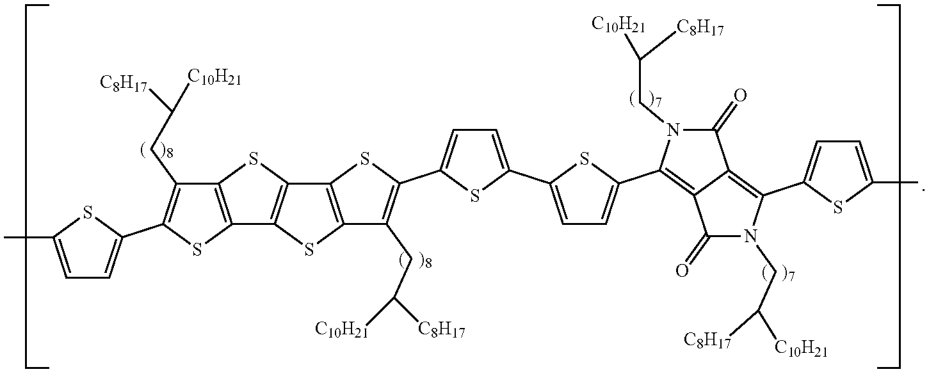

Additional features and advantages will be set forth in the detailed description which follows, and in part will be readily apparent to those skilled in the art from the description or recognized by practicing the embodiments as described in the written description and claims hereof, as well as in the appended drawings.

It is to be understood that both the foregoing general description and the following detailed description are merely exemplary, and are intended to provide an overview or framework for understanding the nature and character of the invention.

BRIEF DESCRIPTION OF THE DRAWINGS

The accompanying drawings are included to provide a further understanding of the description, and are incorporated in and constitute a part of this specification. The drawings are not necessarily to scale, and sizes of various elements may be distorted for clarity. The drawings illustrate one or more embodiment(s) and together with the description serve to explain the principles and operation of the embodiments.

FIG. 3A shows that sensors in chlorobenzene solvent using embodied materials have higher sensitivity than prior art TFB materials. FIG. 3B shows sensor response as a function of ammonia concentration for sensors in xylene. FIG. 3C shows sensor response as a function of ammonia concentration for sensors in tetralin. Sensing time is fixed at 30 s. Sensing time for all samples is fixed at 30 s.

DETAILED DESCRIPTION

Figure 1A:
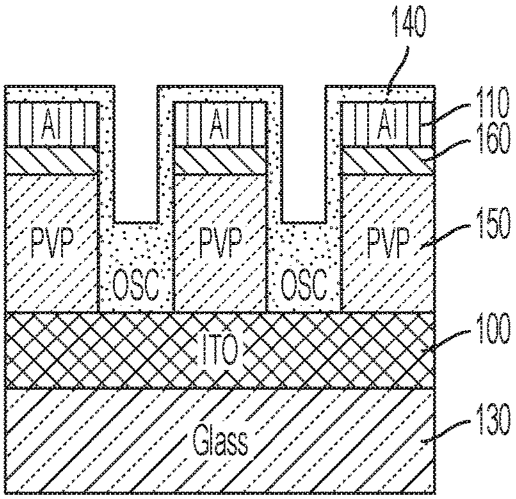
FIGS. 1A and 1B describe structures of two different versions of a polymer vertical transistor.

Before the present materials, articles, and/or methods are disclosed and described, it is to be understood that the aspects described below are not limited to specific compounds, synthetic methods, or uses as such may, of course, vary. It is also to be understood that the terminology used herein is for the purpose of describing particular aspects only and is not intended to be limiting.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated integer or step or group of integers or steps but not the exclusion of any other integer or step or group of integers or steps.

It must be noted that, as used in the specification and the appended claims, the singular forms "a," "an" and "the" include plural referents unless the context clearly dictates otherwise. Thus, for example, reference to "a carrier" includes mixtures of two or more such carriers, and the like.

"Optional" or "optionally" means that the subsequently described event or circumstance may or cannot occur, and that the description includes instances where the event or circumstance occurs and instances where it does not.

Where a range of numerical values is recited herein, comprising upper and lower values, unless otherwise stated in specific circumstances, the range is intended to include the endpoints thereof, and all integers and fractions within the range. It is not intended that the scope of the claims be limited to the specific values recited when defining a range. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed.

When the term "about" is used in describing a value or an end-point of a range, the disclosure should be understood to include the specific value or end-point referred to. When a numerical value or end-point of a range does not recite "about," the numerical value or end-point of a range is intended to include two embodiments: one modified by "about," and one not modified by "about." It will be further understood that the endpoints of each of the ranges are significant both in relation to the other endpoint, and independently of the other endpoint.

The term "alkyl group" as used herein may be a branched or unbranched saturated hydrocarbon group of 1 to 40 carbon atoms (or with a number of carbon atoms as defined by the nomenclature $C_\gamma$-$C_\zeta$, where $\gamma$ and $\zeta$ are a numerical values with $\gamma<\zeta$), such as methyl, ethyl, n-propyl, isopropyl, n-butyl, isobutyl, t-butyl, pentyl, hexyl, heptyl, octyl, decyl, or tetradecyl, and the like. The alkyl group may be substituted or unsubstituted. The term "unsubstituted alkyl group" is defined herein as an alkyl group composed of just carbon and hydrogen. The term "substituted alkyl group" is defined herein as an alkyl group with one or more hydrogen atoms substituted with a "substituent" consisting of $C_1$-$C_{20}$ alkyl, $C_1$-$C_{20}$ alkenyl, $C_1$-$C_{20}$ alkynyl, $C_3$-$C_{20}$ cycloalkyl, halogen, hydroxy, $C_6$-$C_{20}$ aryl, $C_6$-$C_{20}$ heteroaryl, alkoxy, carboxy, carboxylic acid, cyano, or heterocyclyl. Unless otherwise constrained by the definition, all substituents may optionally be further substituted by 1, 2, or 3 substituents chosen from $C_1$-$C_{20}$ alkyl, hydroxy, halogen, or $CF_3$.

The term "alkyl group" as defined herein also includes cycloalkyl and cycloalkenyl groups, either of which may be optionally substituted with a substituent as defined above.

The term "cycloalkyl group" as used herein is a non-aromatic carbon-based ring composed of at least 3 carbon atoms, and in some embodiments from 3 to 20 carbon atoms. Examples of cycloalkyl groups include, but are not limited to, cyclopropyl, cyclobutyl, cyclopentyl, cyclohexyl, etc. The term cycloalkyl group also includes a heterocycloalkyl group, where at least one of the carbon atoms of the ring may be substituted with a heteroatom such as, but not limited to, nitrogen, oxygen, sulfur, or phosphorus. The term "cycloalkenyl" refers to carbocyclic groups of from 3 to 20 carbon atoms having a single cyclic ring or multiple condensed rings with at least one double bond in the ring structure.

The term "aryl group" as used herein may be any carbon-based aromatic group, fused carbon-based aromatic group, including, but not limited to, benzene, naphthalene, etc. The term "aryl group" also includes "heteroaryl group," meaning an aromatic ring composed of at least three carbon atoms that has at least one heteroatom incorporated within the ring of the aromatic group. Examples of heteroatoms include, but are not limited to, nitrogen, oxygen, sulfur, and phosphorus. The aryl group may be substituted or unsubstituted. The aryl group may be substituted with one or more groups including, but not limited to, $C_1$-$C_{20}$ alkyl, $C_1$-$C_{20}$ alkynyl, $C_1$-$C_{20}$ alkenyl, halo, nitro, amino, or hydroxyl. In some embodiments, the term "aryl group" may be limited to substituted or unsubstituted aryl and heteroaryl rings having from 6 to 40 carbon atoms.

The term "halogen" or "halo" refers to a fluoro, bromo, chloro, or iodo group.

The term "alkenyl group" is defined as a branched or unbranched hydrocarbon group of 2 to 40 carbon atoms and structural formula containing at least one carbon-carbon double bond.

The term "alkynyl group" is defined as a branched or unbranched hydrocarbon group of 2 to 40 carbon atoms and a structural formula containing at least one carbon-carbon triple bond.

The term "conjugated group" is defined as a linear, branched or cyclic group, or combination thereof, in which p-orbitals of the atoms within the group are connected via delocalization of electrons and wherein the structure may be described as containing alternating single and double or triple bonds and may further contain lone pairs, radicals, or carbenium ions. Conjugated cyclic groups may comprise one of or both aromatic and non-aromatic groups, and may comprise polycyclic or heterocyclic groups, such as diketopyrrolopyrrole. Ideally, conjugated groups are bound in such a way as to continue the conjugation between the thiophene moieties they connect. In some embodiments, "conjugated groups" may be limited to conjugated groups having 3 to 30 carbon atoms.

"PTDC16DPPTDC17FT4" as used herein is a shorthand or coded designation for the polymer structure poly[(3,7-diheptadecylthieno[3,2-b]thieno[2',3':4,5] thieno[2,3-d]thiophene-2,6-diyl) [2,5-d]hexadecyl-3,6-di(thiophen-2-yl)pyrrolo[3,4-c.]yrrole-1,4(2H,5H)-dione]-5,5'-diyl, described graphically as:

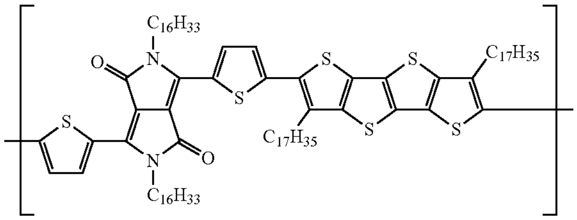

representing in order of occurrence from right to left: the "P" is a polymer comprised of one "T" or thiophene unit, the"DC16DPP" is a diketopyrrolopyrrole (DPP) having N,N'-substitutents of two $C_{16}H_{33}$ groups, "T" is for an intervening thiophene, DC17FT4 for a fused thiophene having four fused rings (FT4) and having two $C_{17}H_{35}$ groups or chains as β-substituents or on the β positions of the FT4 portion.

"PTDC8BC8C10DPPTDC17FT4" as used herein is a shorthand or coded designation for the polymer structure poly[(3,7-diheptadecylthieno[3,2-b]thieno[2',3':4,5] thieno [2,3-d]thiophene-2,6-diyl) [2,5-d]8-octyl-octadecyl-3,6-di (thiophen-2-yl)pyrrolo[3,4-c.]yrrole-1,4(2H,5H)-dione]-5, 5'-diyl, described graphically as:

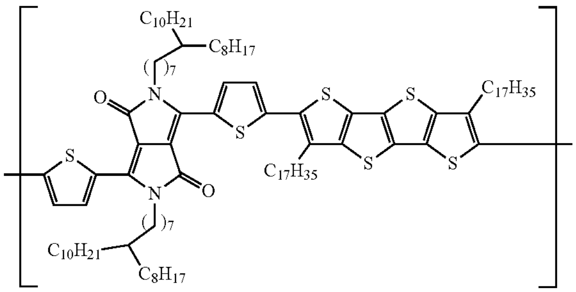

representing in order of occurrence from right to left: the "P" is a polymer comprised of one "T" or thiophene unit, the"DC8BC8C10DPP" is a diketopyrrolopyrrole (DPP) having N,N'-substitutents of two $C_8H_{15}(C_8H_{17}C_{10}H_{21})$ groups, "T" is for an intervening thiophene, "DC17FT4" for a fused thiophene having four fused rings ("FT4") and having two $C_{17}H_{35}$ groups or chains as β-substituents or on the β positions of the FT4 portion. This structure is also referenced as "$C_{250}$" in the figures.

"P2TDC8BC8C10DPP2TDC9BC8C10FT4" as used herein is a shorthand or coded designation for the polymer structure poly[(3,7-di(9-octyl-nonadecyl)thieno[3,2-b] thieno[2',3':4,5] thieno[2,3-d]thiophene-2,6-diyl) [2,5-d]8-octyl-octadecyl-3,6-di(thiophen-2 -yl) pyrrolo[3,4-c.]yrrole-1,4(2H,5H)-dione]-5,5'-diyl,:

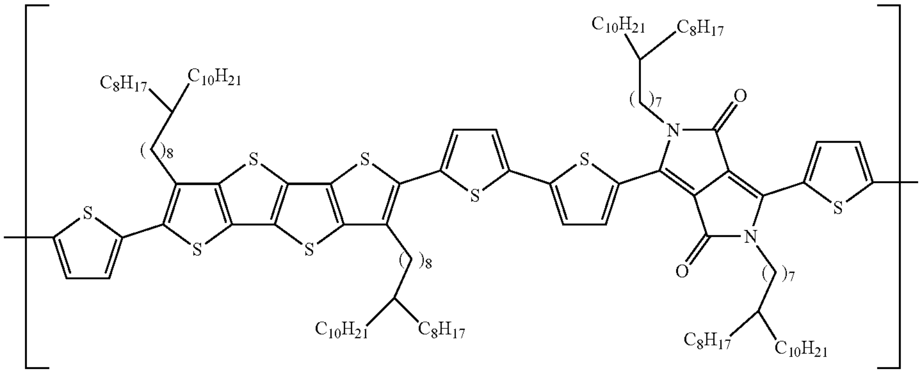

representing in order of occurrence from right to left: the "P" is a polymer comprised of two "T's" or thiophene units, the "DC8BC8C10DPP" is a diketopyrrolopyrrole (DPP) having N,N'-substitutents of two $C_8H_{15}(C_8H_{17}C_{10}H_{21})$ groups, "2T" is for an intervening two thiophenes, "DC9BC8C10" for a fused thiophene having four fused rings ("FT4") and having two $C_9H_{17}(C_8H_{17}C_{10}H_{21})$ groups or chains as β-substituents or on the β positions of the FT4 portion. This structure is also referenced as "C300-XXXXXX" in the figures, with the "XXXXXX" value varying depending on sample.

Disclosed are devices incorporating thiophene-based polymeric compounds along with methods of making. It is understood that while combinations, subsets, interactions, groups, etc. of these materials are disclosed, it may be the case that while specific reference of each and every various individual and collective combination and permutation of these compounds may not be explicitly disclosed, all combinations and permutations are specifically contemplated and incorporated herein. Thus, if a class of molecules A, B, and C are disclosed as well as a class of molecules D, E, and F and an example of a combination molecule, A-D may be disclosed, then even if each is not individually recited, each may be individually and collectively contemplated. Thus, in this example, each of the combinations A-E, A-F, B-D, B-E, B-F, C-D, C-E, and C-F are specifically contemplated and should be considered disclosed from disclosure of A, B, and C; D, E, and F; and the example combination A-D. Likewise, any subset or combination of these may be also specifically contemplated and disclosed. Thus, for example, the subgroup of A-E, B-F, and C-E are specifically contemplated and should be considered disclosed from disclosure of A, B, and C; D, E, and F; and the example combination A-D. This concept applies to all aspects of this disclosure including, but not limited to, steps in methods of making and using the disclosed compositions. Thus, if there are a variety of additional steps that may be performed it may be understood that each of these additional steps may be performed with any specific embodiment or combination of embodiments of the disclosed methods, and that each such combination may be specifically contemplated and should be considered disclosed.

Devices

The present disclosure is directed to organic-based sensing devices and in particular, to devices for sensing changes in molecular concentrations in gases. Embodiments have been developed that detect ultrasensitive (down to 30 ppb) changes. Clinical trials to detect breath ammonia in patients with chronic kidney disease (CKD) demonstrate a correlation as 0.82 between the ammonia sensor response and the blood urea nitrogen in hemodialysis patients (40 patients) (see Davies et al. 52 Kidney Int'l 223 (1997)). Additional research shows that breath ammonia exhibits a good correlation to blood urea nitrogen and hence may be a biomarker for improving the treatment in CKD patients. In order to fully address this need, device improvements that show lower detection levels and higher response rates are needed.

An organic vertical transistor is similar to a solid-state version of a vacuum tube triode. The vacuum tube triode consists of the cathode for electron emission by heating, the anode for electron collection, and the grid for current modulation. The anode is always positively biased against the cathode. In a vacuum tube triode, both the grid and anode electrodes are able to control the potential within the device but the grid is much more effective in controlling the gradient near the cathode. The on and off state of the vacuum tube triode is determined by whether the emitted electrons encounter a large energy barrier between cathode and anode or not. When the grid is in large and negative bias, the electrons experience a negative gradient of potential after they are emitted from cathode, and consequently very few of them can be collected by the anode. On the contrary, if the grid is slightly negative biased or positively biased, it is possible for the electrons to find a passage through the potential minimum between two grid wires.

An embodied ultrasensitive gas sensor based on a vertical-channel organic semiconductor (OSC) diode (or considered as vertical transistor if the sensing terminal acts as the third terminal) is shown in FIG. 1A, and additional designs can be found, for example, in 88 Appl. Phys. Lett. 223510 (2006) and 9 Org. Electron. 310 (2008), both of which are incorporated by reference. The detector comprises an emitter 100, an organic semiconductor 140, and a metal grid-based collector 110. Additional components include a substrate 130, an insulator 150, and an optional adhesion or treatment layer 160. Example materials for the device include aluminum for the collector and grid, indium tin oxide for the emitter, glass for the substrate, an insulator made from polyvinylpyrrolidone (PVP), and a thiophene-based polymer for the organic semiconductor.

Figure 1B:
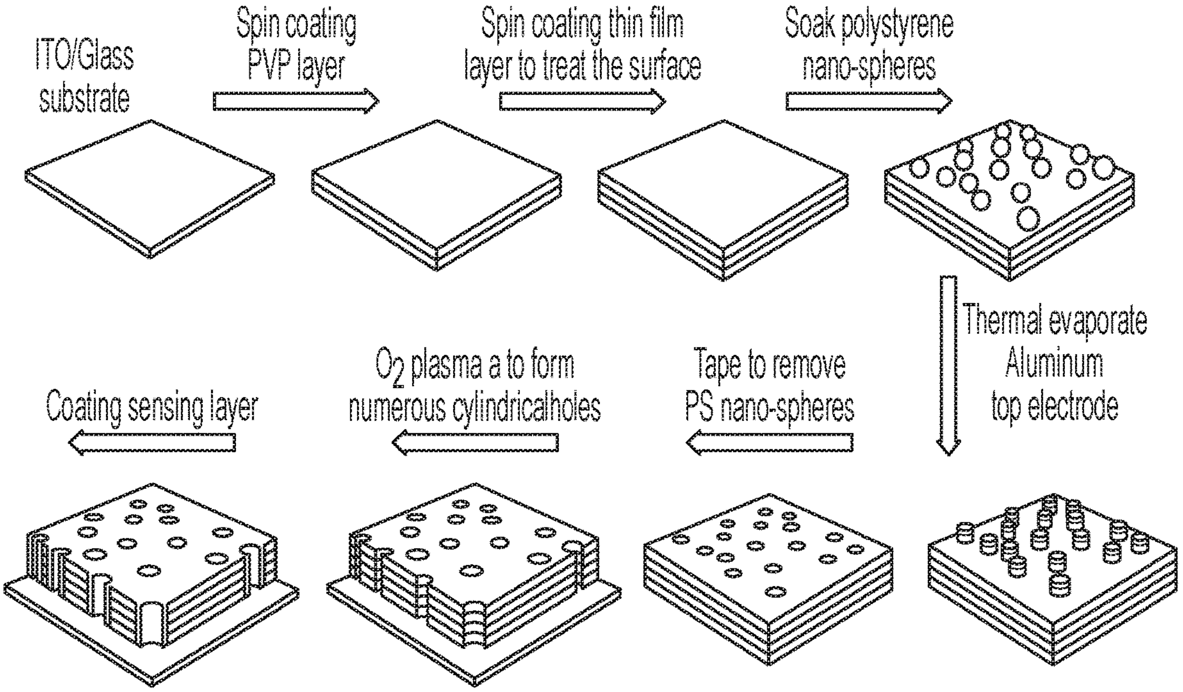

Returning to FIG. 1A, the top electrode, in some embodiments a porous material (40 nm thickness Al in this example), that contains a density of small round openings (with diameters of 100 nm), which are made by colloid lithography, as shown in FIG. 1B and described below. The organic semiconductor layer connects the emitter and collector to deliver a vertical current flow. The nano-porous top-electrode structure enables the contact between ambient gas molecules and the vertical organic channel. Molecules (such as amine) can diffuse into the organic layer through the gas pores and redox reaction chemistry between the organic semiconductor and the molecular gases occurs. When gas molecules such as the ammonia molecules reduce the organic channel, the current is reduced (amine gases absorb on the organic chain, react with sulfur atoms and form polarons to reduce the polymer chain, resulting in the hole concentration in the organic becoming lower and a resultant decrease of conductance). When ammonia molecules are removed from ambient, the current gradually recovers.

Unexpectedly, the use of high performance thiophene-based organic semiconductors provides distinct advantages when combined with the described vertical transistor designs, including low operation voltages (≤2 V, such as 2V or less, 1.5V or less, 1.25V or less or 1V or less), high output current density (current densities of 80 $mA/cm^2$, 90 $mA/cm^2$, 100 $mA/cm^2$, 110 $mA/cm^2$, 120 $mA/cm^2$, 130 $mA/cm^2$, 140 $mA/cm^2$, 150 $mA/cm^2$, or 160 $mA/cm^2$) with large effective surface area resulting in high sensitivity (e.g. ppb level), larger sensitivity ranges in the low concentration regime (e.g., 5-300 ppb), and longer shelf lifetimes due to material stability. And because there is no need for an encapsulation layer, the device fabrication process is simpler and scalable for large area requiring a little as two mask levels and allowing for the use of a variety of hydrocarbon solvents. Further, the combination of thiophene-based organic semiconductors with vertical transistor designs is suitable for large scale production because the devices do not require toxic solvents as high performance organic vertical transistors can be achieved by using nontoxic solvents, such as xylene and tetraline.

Compounds

Compounds that may be used in the detectors described herein include a number of thiophene-based materials. The compounds may be synthesized using standard techniques and may be solution processable. Accordingly, detectors incorporating these compounds may be manufactured using solution deposition techniques such as inkjet printing, dip and/or spin coating, and screen printing, to name a few.

The compounds described herein contain alternating blocks of aromatic, heteroaromatic or ethenylene acceptor groups (Ar groups, also referred to as electron withdrawing groups or electron accepting groups) and blocks of thiophene-based donor groups, along a compound backbone. The acceptor blocks contribute to the electron transport, while the donor blocks contribute to the hole transport.

The repeating unit of the polymeric compounds is of the general formula I:

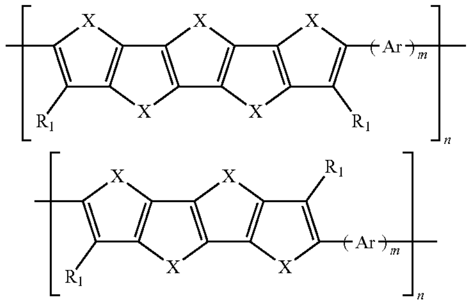

m is an integer from 1 to 10, n is an integer from 2 to 10,000, and each Ar is independently an optionally substituted conjugated group, an optionally substituted aryl group, or an optionally substituted heteroaryl group. In some embodiments, each Ar is independently one of the following:

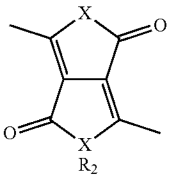

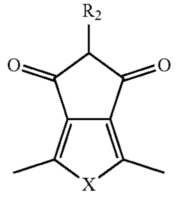

-continued

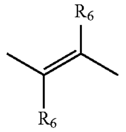

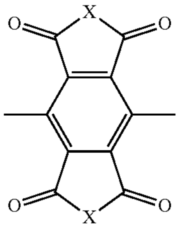

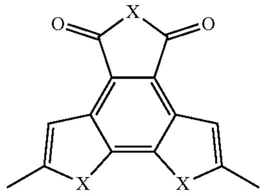

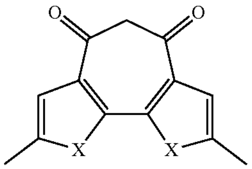

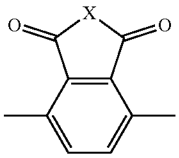

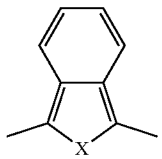

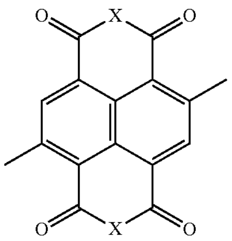

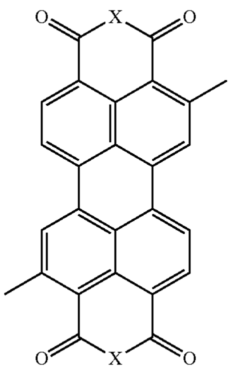

-continued

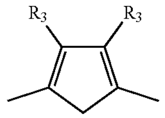

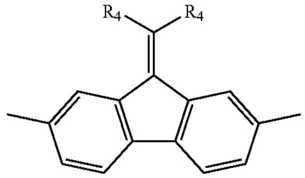

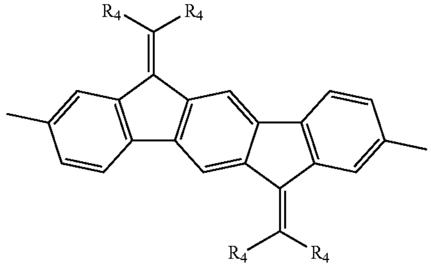

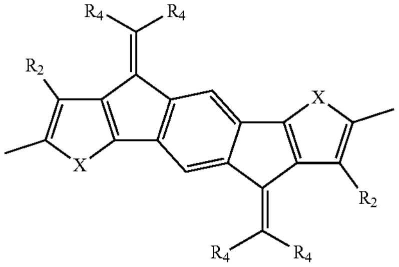

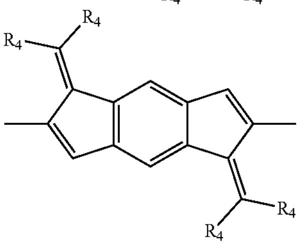

where each x is independently $NR_5$, S, Se, or O; each $R_2$ is independently hydrogen, $C_1$-$C_{40}$ alkyl, $C_1$-$C_{40}$ alkenyl, $C_1$-$C_{40}$ alkynl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo; each $R_3$ is independently hydrogen, $C_1$-$C_{40}$ alkyl, $C_1$-$C_{40}$ alkenyl, $C_1$-$C_{40}$ alkoxy, $C_1$-$C_{40}$ cycloalkyl, $C_1$-$C_{40}$ aryl, $C_1$-$C_{40}$ heteroaryl, or $C_1$-$C_{40}$ conjugated group, any of which may be optionally substituted; each $R_5$ is independently hydrogen, $C_1$-$C_{40}$ alkyl; each $R_4$ is independently hydrogen, $C_1$-$C_{40}$ alkyl, cyano, ester, or carboxylic acid, and each $R_6$ is independently hydrogen, $C_1$-$C_{40}$ alkyl, cyano, ester, or carboxylic acid.

The side chains, $R_1$, $R_2$, $R_3$, $R_4$, and $R_6$ can play a significant role in the solubility, stability, or film forming properties (including structure, adhesion, organization, processability, and the like) of the polymers. In some embodiments, one or more of $R_1$, $R_2$, $R_3$, $R_4$, and $R_6$ is an optionally substituted $C_{15}$-$C_{35}$ alkyl. In some embodiments, one or more of $R_1$, $R_2$, $R_3$, or $R_4$ is an optionally substituted $C_{15}$-$C_{35}$ alkyl having at least one branching point. In particular, one or more of $R_1$, $R_2$, or $R_3$ can be optionally substituted $C_{15}$-$C_{35}$ alkyl. In some embodiments, each $R_1$ or $R_2$ is independently an optionally substituted $C_{15}$-$C_{35}$ alkyl.

In some embodiments, each $R_1$ or $R_2$ is independently an optionally substituted $C_{15}$-$C_{35}$ alkyl having at least one branching point. In some embodiments each $R_1$ or $R_2$ is independently an optionally substituted $C_{15}$-$C_{35}$ alkyl having at least one branching point, where the branching point is at least 4 carbons from the base molecule.

While it may be expected that the large, branched alkyl side chains would inhibit stacking or structured organization of the polymer, these potential issues have not been observed. Rather, it is hypothesized that the embodied polymers provide superior properties when branched alkyl chains are at least four carbons away from the main polymer backbone, thereby producing no or very low steric effect, which would interfere with the π-stacking of the polymer backbones, and the existence of four large, nonpolar branched side chains in one polymer repeat unit significantly increases the solubility of these polymers, thus allowing for an increase in the molecular weight of the polymers, which may result in an enhanced mobility over current high performance polymers. In some embodiments, the polymers have molecular weights of from about 30-80 kDa or 40-60 kDa.

Example embodied thiophene-based structures are shown in below:

| No. | Ar | $Ar_{groups}$ |
|---|---|---|
| 1 | 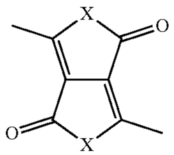 | X = N-$R_7$<br>$R_7$ = $C_8H_{16}(C_8H_{17}C_{10}H_{21})$ |
| 2 | 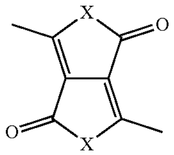 | X = N-$R_7$<br>$R_7$ = $C_8H_{16}(C_8H_{17}C_{10}H_{21})$ |
| 3 | 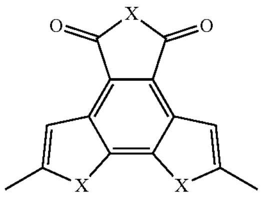 | X = S |
| 4 | 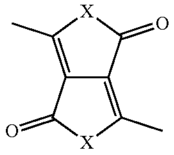 | X = N-$R_7$<br>$R_7$ = $C_8H_{16}(C_8H_{17}C_{10}H_{21})$ |

Methods

Another aspect comprises methods of making the compounds and devices described herein. Synthesis of the disclosed monomers, oligomers and polymers can be done without undue experimentation based on references in the literature. Example embodied compounds may be found, for example, in U.S. Pat. Nos. 7,705,108, 7,838,623, 8,389,669, 7,893,191, and 8,624,232, all of which are incorporated herein by reference in their entirety.

Construction of embodied devices can be done using methods known in the art. The substrate is generally an inert, non-conductive surface that can be subjected to the necessary conditions to produce the device, including elevated temperatures and organic solvents. Glass, glass ceramics, ceramics, and some plastics may be used. Generally, it is preferable to have the substrate be transparent where the device is going to be used in a display or emission-based application. A transparent conductive oxide can then be coated onto the substrate via known methods such as sputter coating. A polymer layer is next coated using known methods (such as spin coating) on the device to produce an insulating layer. In some embodiments, a thin polymer surface modification layer (e.g., P3HT) is coated on insulating layer to modify the surface energy. Next a metal mask layer is produced using one or more known methods, including lithography or via a two-step process of coating the substrate with polymer spheres (diameter: 30-400 nm), which adsorb to the substrate and serve as a mask for the following base electrode deposition, and are then subsequently removed via solvent, heating, or polymer adhesion. The base electrode can be any conductive material (Cu, Ag, Al, Au, Pt, etc.) that works for the device in a thickness (20 nm-1 um) that provides the conduction necessary. In some embodiments, an optional insulating layer is coated on the base electrode. The top layer of the device is then subjected to etching to open the channels in the electrode and, in some embodiments, form an oxide on the electrode surface. The device is finished by the deposition of a thiophene-based compound as described here and coated with a top electrode, which can be any conductive material (Cu, Ag, Al, Au, Pt, etc.) that works for the device in a thickness (20 nm-1 um) that provides the conduction necessary. Alternative designs are also contemplated and can be formed using the processes described herein, known in the art, or shown in 88 Appl. Phys. Lett. 223510 (2006) and 9 Org. Electron. 310 (2008), both of which are incorporated by reference.

EXAMPLES

The following examples are put forth so as to provide those of ordinary skill in the art with a complete disclosure and description of how the materials, articles, and methods described and claimed herein are made and evaluated, and are intended to be purely exemplary and are not intended to limit the scope of the description. Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, desired solvents, solvent mixtures, temperatures, pressures and other reaction ranges and conditions that may be used to optimize the product purity and yield obtained from the described process. Only reasonable and routine experimentation will be required to optimize such process conditions.

Synthesis: The specific example materials, P2TBTD2TDC9BC8C10FT4, PTBTDTDC9BC8C10FT4, and P2TDC8BC8C10DPP2TDC9BC8C10FT4:

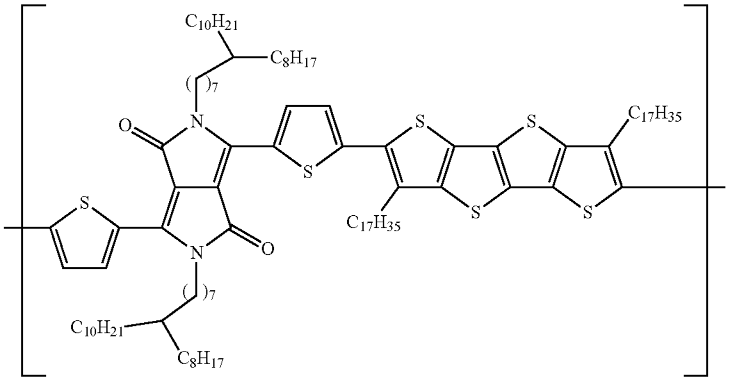

PTDC8BC8C10DPPTDC17FT4

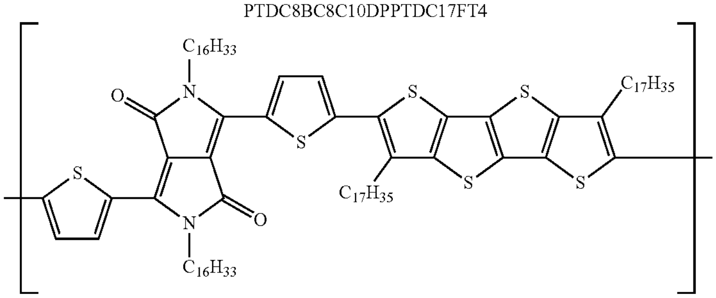

PTDC16DPPTDC17FT4

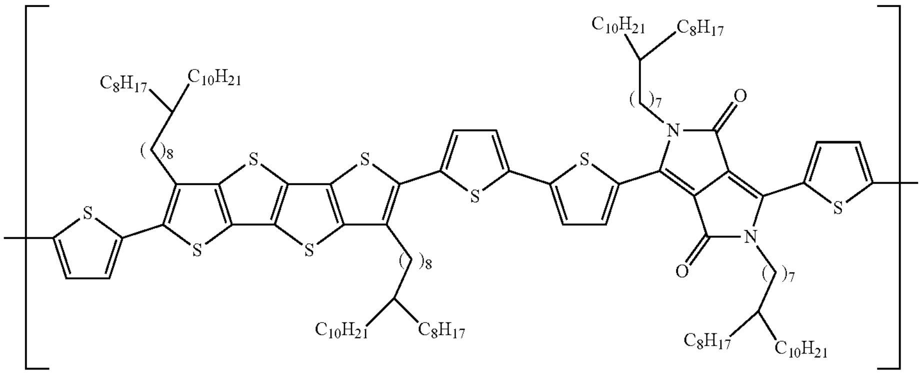

P2TDC8BC8C10DPP2TDC9BC8C10FT4 can be synthesized by the general procedures disclosed in U.S. Pat. Nos. 7,705,108, 7,838,623, 8,389,669, and 7,893, 191 and described herein. The detailed synthetic procedure is given here for PTBTDTDC9BC8C10FT4 as an example, but can modified and applied to other compounds. The monomers and catalyst materials are weighed into a flask and the solvent (m-xylene) added. The polymerization is then carried out at 125° C. for 1 h. The material is then precipitated, filtered, dried then extracted in a soxhlet to remove any residual monomers and catalyst species. Finally, the polymer is dissolved from the soxhlet, re-precipitated and dried under vacuum. The organic semiconductors (OSC) are used as the active material in vertical transistors with high output current density and a long lifetime without encapsulation.

Device Fabrication: Ammonia sensors with cylindrical nanopore structures are fabricated via a colloid lithography method. First, a cross-linkable poly(4-vinylphenol) (PVP) layer (thickness ~250 nm) is spin-coated onto an indium tin oxide (ITO) patterned glass substrate and annealed at 200° C. for 1 h. Then, to enhance the absorption of polystyrene (PS) nanospheres on PVP, the PVP surface is treated by UV ozone treatment or by coating a surface modification layer on the PVP. The properties of the surface modification layer depend on the nanospheres surface charge (nanospheres with surface functional group). For example, if the nanospheres exhibit a negative charge on surface, then the PVP surface can be adjusted to be positively charged. After coating the polystyrene nanospheres onto the surface, the substrate is submerged into a dilute ethanol solution of negatively charged polystyrene (PS) spheres (Fluka). Optimized sphere densities (5-8#/$\mu m^2$) are obtained by using a concentration of the PS spheres of about 0.24 wt % with a 40 s soaking time. The wet substrate is then dipped into boiling IPA for 10 s to remove excess PS spheres not absorbed on the sensing layer. Finally, the substrate is blown dry by nitrogen immediately after dipping into IPA.

The nanospheres serve as a shadow mask during subsequent deposition of the Al electrode. After deposition of the Al, the spheres are removed via 3M Scotch Tape to form a porous top electrode. The thickness of the Al electrode is 40 nm and the diameter of the holes are ~200 nm. Next, to form a cylindrical pore structure, the PVP in the areas not covered by the electrode is etched by oxygen plasma. Embodied materials are then blade-coated onto this structure in one of three solvents—chlorobenzene, xylene, or tetralin.

Figure 2A:
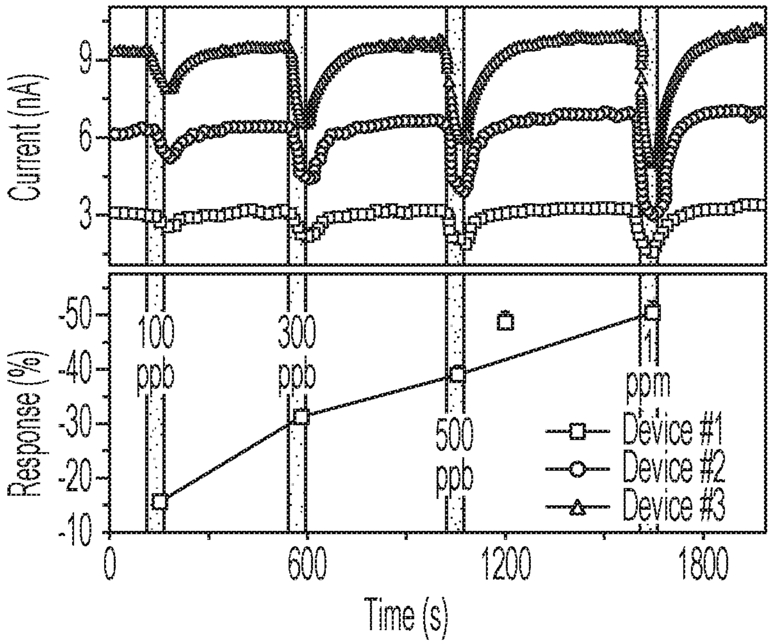
FIGS. 2A and 2B show real-time current measurements of (a) three individual sensors using poly[(9,9-dioctylfluorenyl-2,7-diyl)-co-(4,4-(N-(4-s-butylphenyl) diphenylamine))] (TFB) material and (b) two individual sensors using Corning material PTDC8BC8C10DPPTDC17FT4 (C250).
Figure 2B:
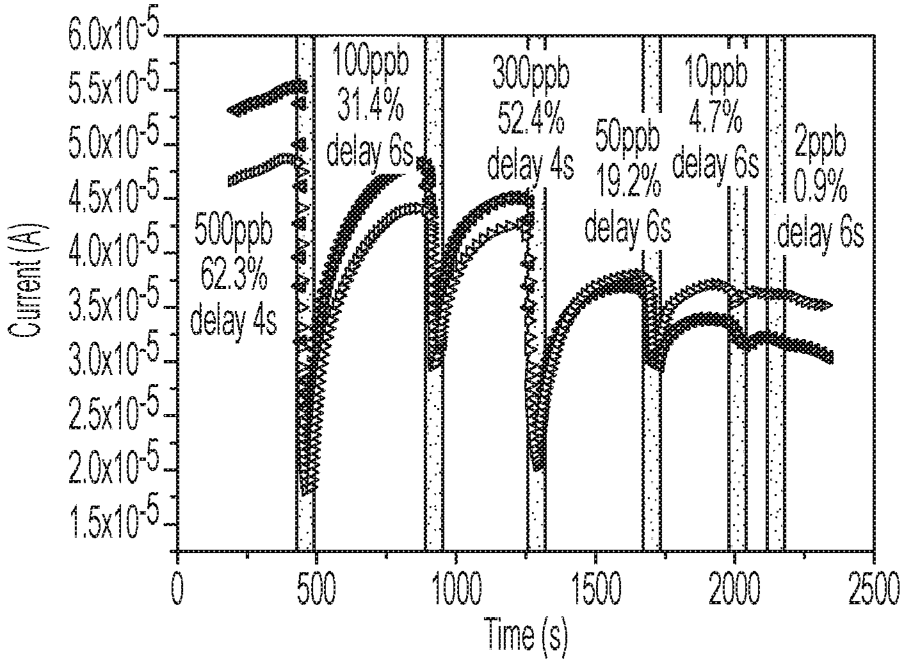

Device Detection Properties: The electrical properties of sensors incorporating thiophene-based materials embodied herein are made and tested. FIG. 2A shows three vertical transistor-based ammonia detectors incorporating TFB (poly[(9,9-dioctylfluorenyl-2,7-diyl)-co-(4,4-(N-(4-s-butylphenyl)diphenylamine))]) and the signal amplitude generated in the devices at a number of different ammonia concentrations. Comparatively, FIG. 2B shows two separate sensors incorporating the thiophene-based PTDC8BC8C10DPPTDC17FT4 as the organic semiconductor. The sensors in FIG. 1B show larger current changes at lower bias voltages than the TFB samples and detection levels of 2 ppb.

Figure 3A:
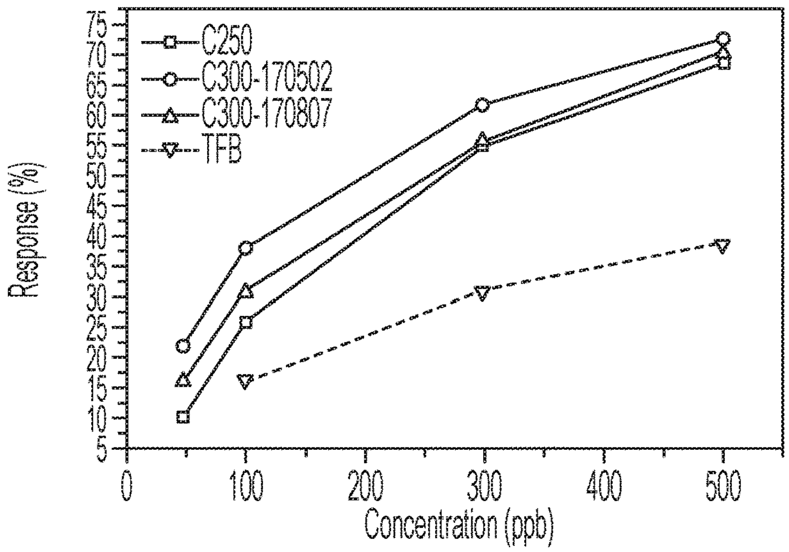
FIGS. 3A-C show sensor response in different solvents as a function of ammonia concentration.
Figure 3B:
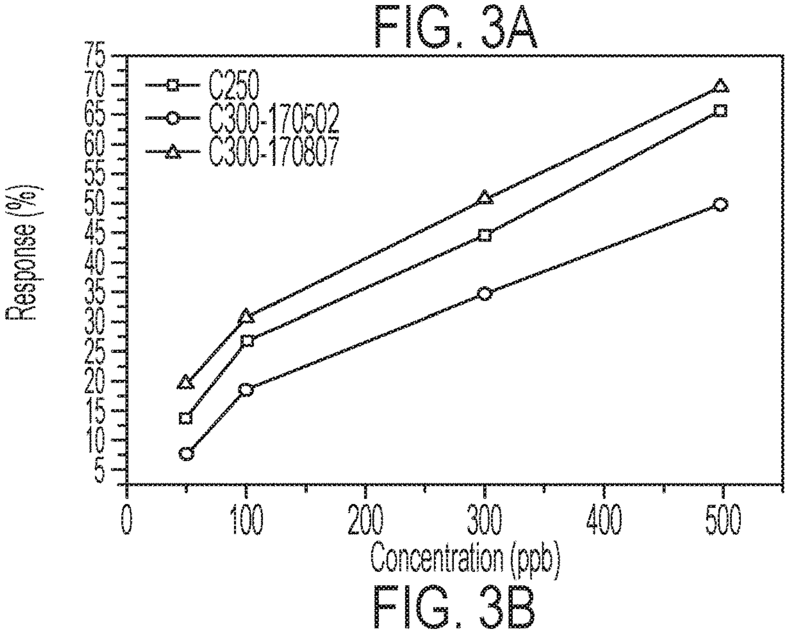
Figure 3C:
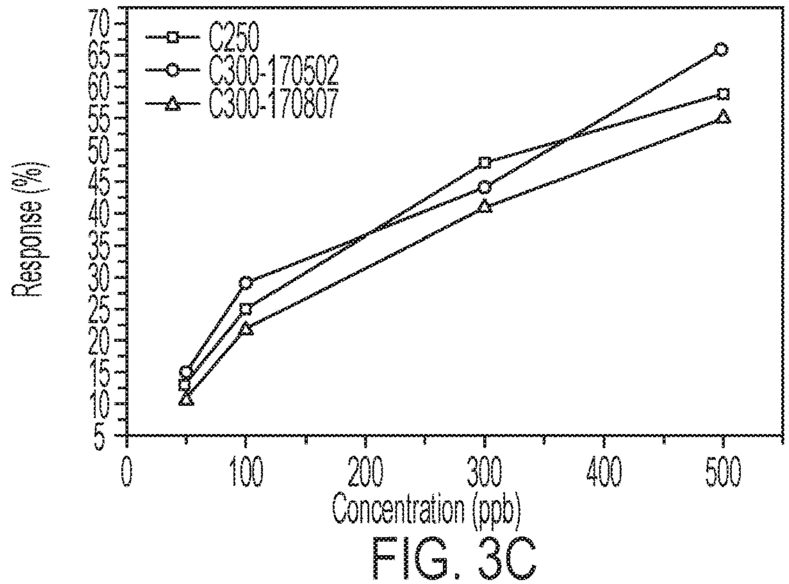
Figure 4A:
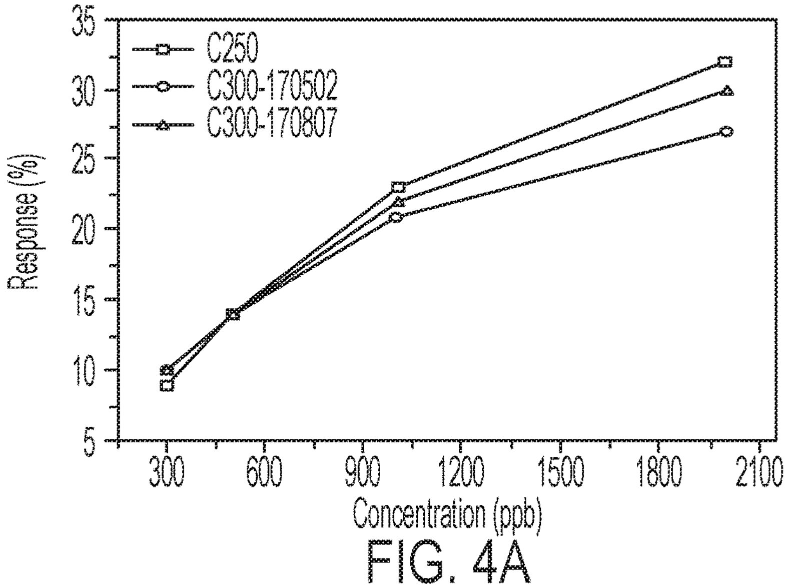
FIGS. 4A-C are graphs showing the dynamic range of the embodied sensors. The semiconductor materials were Corning materials PTDC8BC8C10DPPTDC17FT4 (C250), and P2TDC8BC8C10DPP2TDC9BC8C10FT4 (C300-170502 and $C_{300}$-170807) and TFB. Sensor response as a function of ammonia concentration in shown for sensors in (a) chlorobenzene, (b) xylene, and (c) tetralin solvent. Here, the larger sensing dynamic range (300 ppb to 2 ppm) is demonstrated for sensing times of 6 s.
Figure 4B:
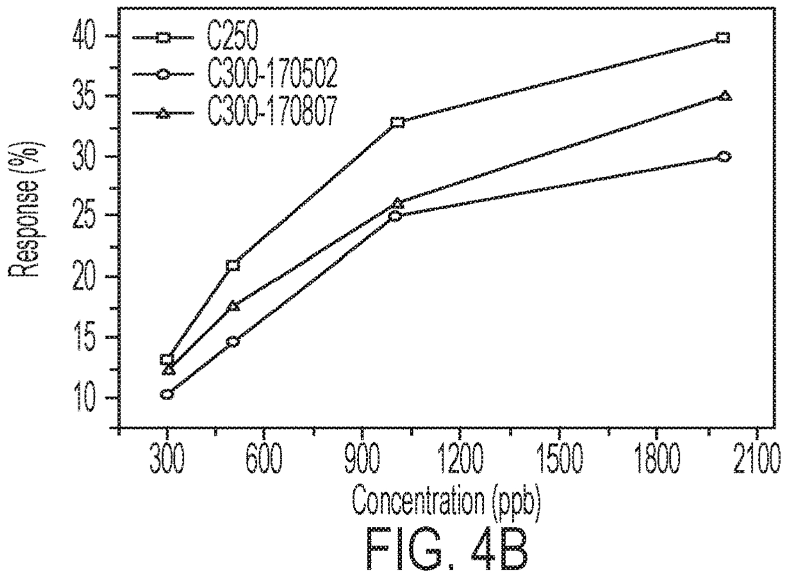
Figure 4C:
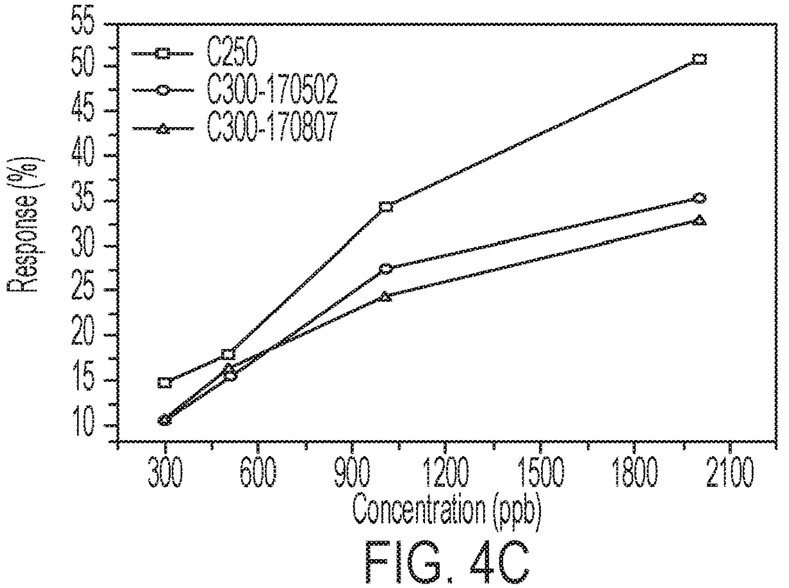

FIGS. 3A-3C show thiophene-based based vertical transistor detectors with a variety of thiophene-based molecules and in different solvents (chlorobenzene, xylene, and tetralin). As can be seen in the figures, devices using PTDC8BC8C10DPPTDC17FT4 (C250) and P2TDC8BC8C10DPP2TDC9BC8C10FT4 (C300-170502 and C300-170807) as the organic semiconductor layer all show strong, generally linear, responses across the ppb-scale range. FIG. 3A also includes a TFB-based device as a comparator to show the much weaker signal strength in a non-thiophene acceptor OSC. FIGS. 4A-4C expand the scale of detection out to ppm and show that the thiophene-based devices have a dynamic range of at least an order of magnitude.

Figure 5A:
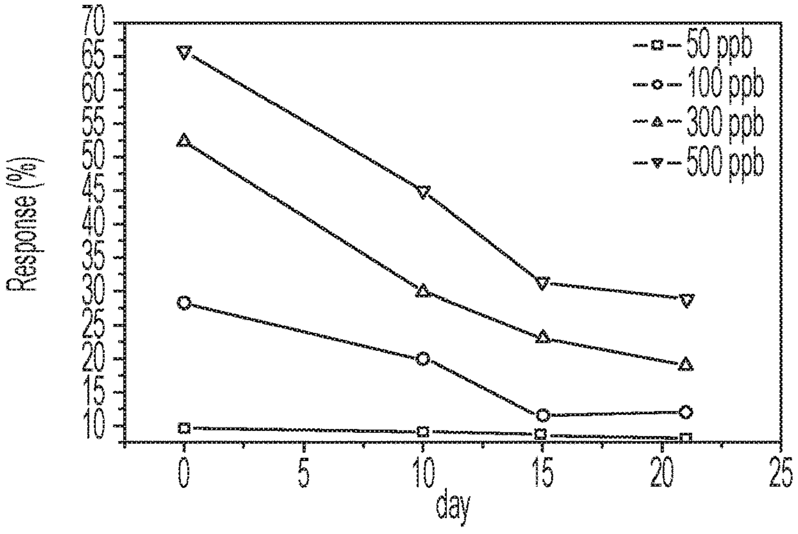
FIGS. 5A-C are graphs showing the stability of the sensors under ambient air conditions (standard temperature (25° C.) and pressure (1 atm)). In this case, the sensors comprise materials P2TDC8BC8C10DPP2TDC9BC8C10FT4 (C300-170502) in xylene (FIG. 5A), P2TDC8BC8C10DPP2TDC9BC8C10FT4 (C300-170807) in xylene (FIG. 5B), and P2TDC8BC8C10DPP2TDC9BC8C10FT4 (C300-170502) in tetralin (FIG. 5C).
Figure 5B:
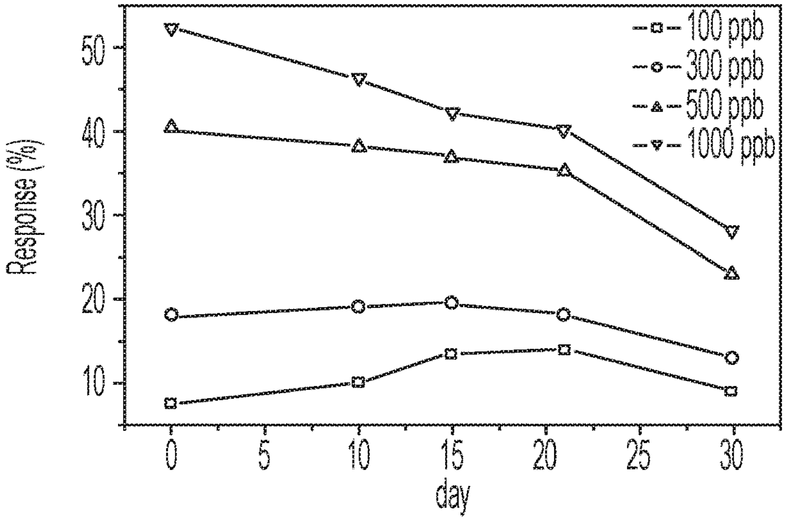
Figure 5C:
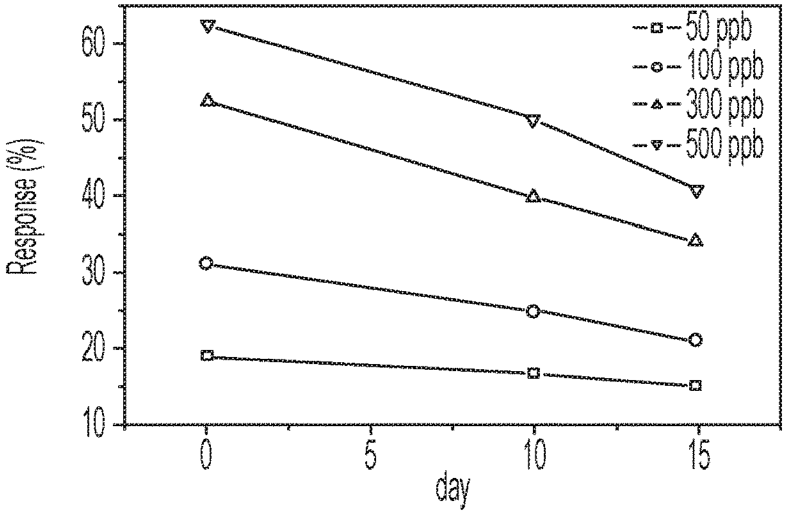
Figure 6:
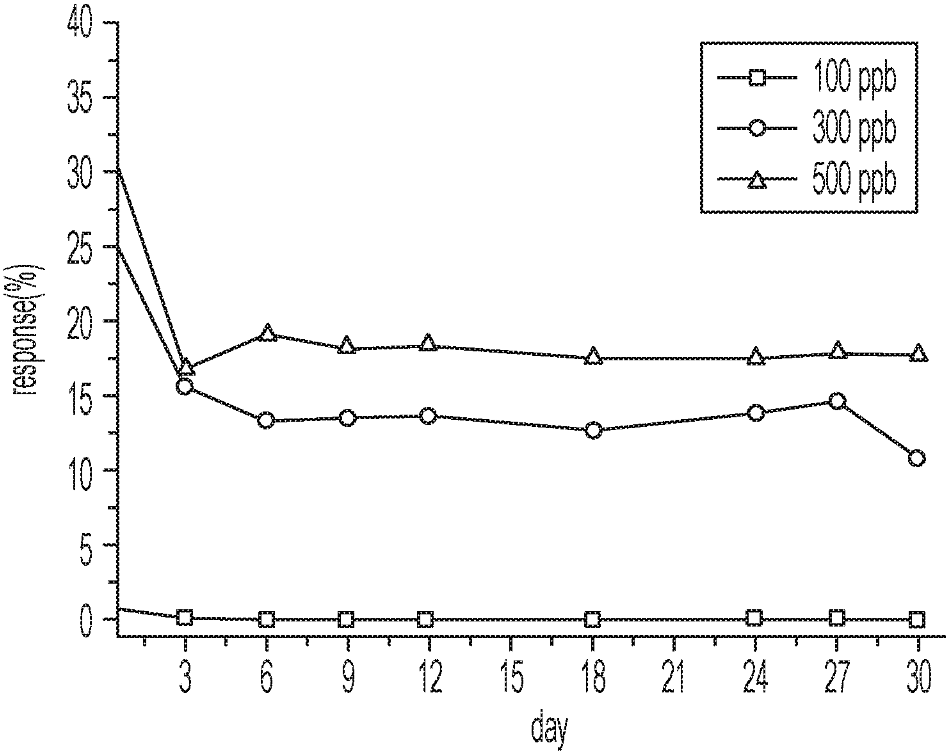
FIG. 6 is a graph of sensor response as a function of storage time (days) in air ambient conditions (standard temperature (25° C.) and pressure (1 atm)). In this case, the embodied sensor uses material PTDC8BC8C10DPPTDC17FT4 (C250) in chlorobenzene.

In addition to sensitivity, the thiophene-based vertical transistor detectors embodied herein show significant stabilities over time. FIGS. 5A-5C provide a thiophene-based vertical transistor detectors incorporating P2TDC8BC10DPP2TDC9BC8C10FT4 as the OSC in a number of different solvents. In each case, and particularly in the case where xylene or tetralin is used as the OSC solvent, the device shows activity even after a period of 21 days at ambient conditions. Similarly, FIG. 6 shows the time-dependent signal for a thiophene-based based vertical transistor detector utilizing PTDC8BC8C10DPPTDC17FT4 in chlorobenzene as the OSC. At all ammonia concentrations, even when exposed to ambient conditions, the device appears to show a constant signal after an initial signal decay over the first few days.

The takeaway is that use of thiophene-based organic semiconductors delivers higher current levels and higher sensing responses to ammonia, particularly in the low concentration regime. Specifically, sensors using the embodied materials deliver current in micro-amp regime at low operation voltages. In general, this property (microamp current at low voltage) enables an easy and low-cost sensor signal read out circuitry.

Gas Sensor with Mixed Polymer: In some examples, the sensor active layer may be changed by mixing two polymers with different molecular structures. Two mixing series are used (series A and series B). For series A, PTDC16DPPTDC17FT4 ("C200") (Mn 28200) is mixed with P2TDC8BC8C10DPP2TDC9BC8C10FT4 ("C300") (Mn 52000) with different ratios (e.g., 1:1, 2:1, and 1:2). For series B, C200 is mixed with PTDC8BC8C10DPPTDC17FT4 ("C250") (Mn 31400) with different ratios (e.g., 1:1, 1:2, and 2:1). The sensors with pure PTDC16DPPTDC17FT4, pure PTDC8BC8C10DPPTDC17FT4, and pure P2TDC8BC8C10DPP2TDC9BC8C10FT4 are also fabricated. Samples in series A and series B are summarized in Table I. The mixed polymer (e.g., A3-A5 in series A and B3-B5 in series B) is dissolved in xylene and the total concentration is fixed as 5 mg/1 mL. Blade coating is conducted at a speed of about 200 mm/s to coat 20 μL of mixed polymer in xylene. Thereafter, the blade-coated film was annealed at 130° C. for about 1 hr.

TABLE 1

| Series A | C200 to C300 ratio | Series B | C200 to C250 ratio |
|---|---|---|---|
| A1 | Pure C200 | B1 | Pure C200 |
| A2 | Pure C300 | B2 | Pure C250 |
| A3 | 1:1 | B3 | 2:1 |
| A4 | 2:1 | B4 | 3:1 |
| A5 | 1:2 | B5 | 4:1 |

Figure 7A:
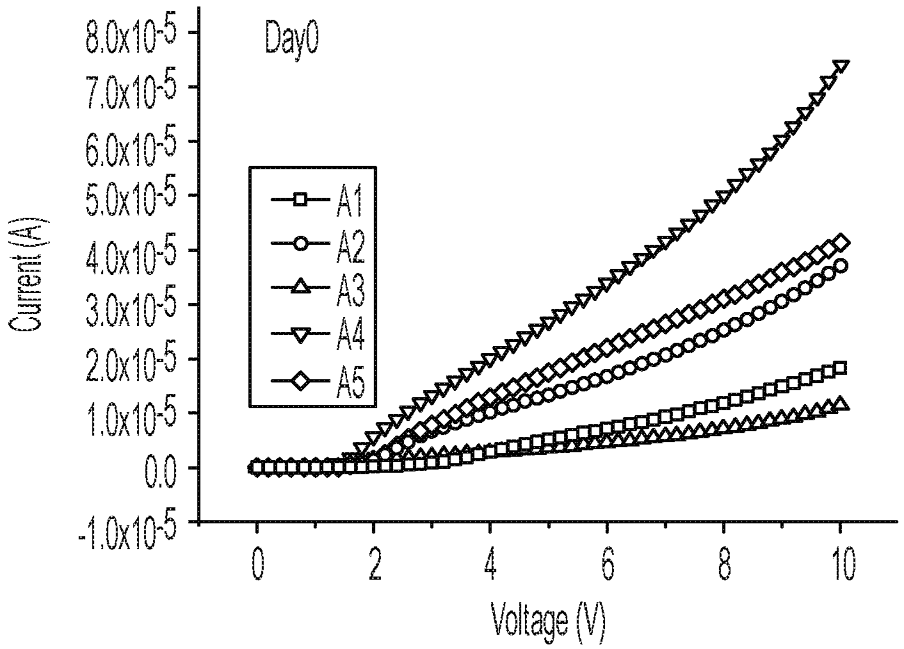
FIGS. 7A and 7B illustrate I-V curves of samples A1-A5 (FIG. 7A) and I-V curves of samples B1-B5 (FIG. 7B).
Figure 7B:
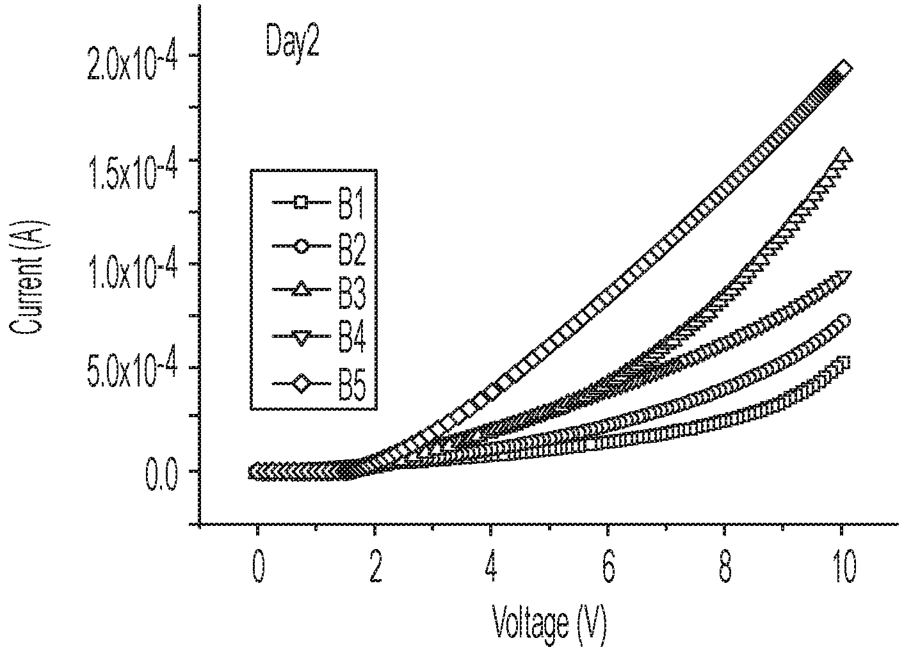

FIGS. 7A and 7B illustrate I-V curves of samples A1-A5 (FIG. 7A) and I-V curves of samples B1-B5 (FIG. 7B). The mixed polymer enhances sensor output current. For example, for series A samples of FIG. 7A (biased at 5V), currents in A4 and A5 were larger than currents in A1 (pure C200) and A2 (pure C300). For series B samples of FIG. 7B (also biased at 5V), currents in B3-B5 (i.e., mixed polymer samples) were larger than currents in B1 (pure C200) and B2 (pure C250). For comparison, series A samples were measured immediately after fabrication while series B samples were measured 48 hours after fabrication.

Figure 8A:
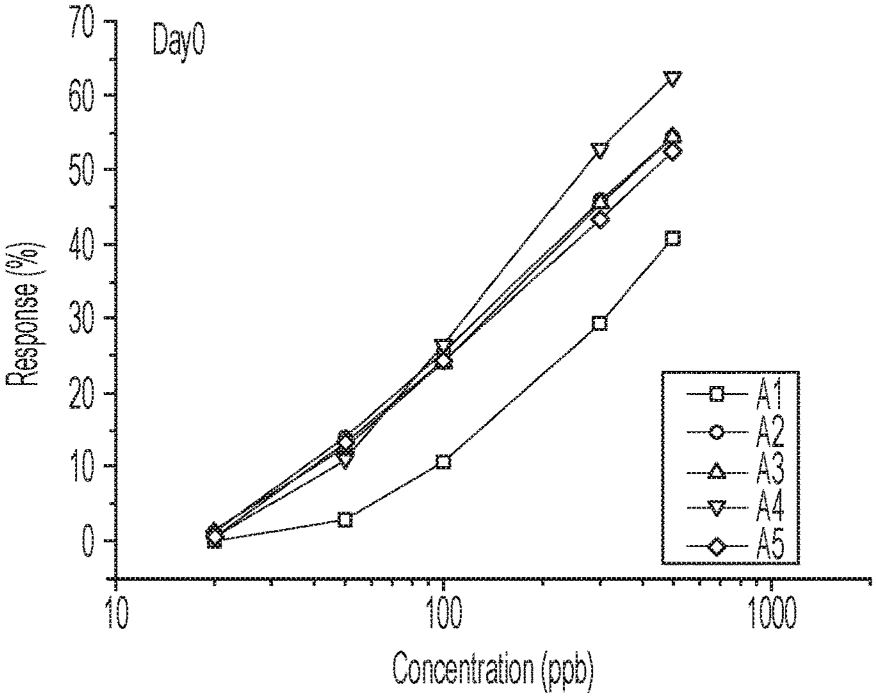
FIGS. 8A and 8B illustrate sensor response as a function of ammonia concentration for samples A1-A5 (FIG. 8A) and samples B1-B5 (FIG. 8B). The x-axis is in logarithm scale.
Figure 8B:
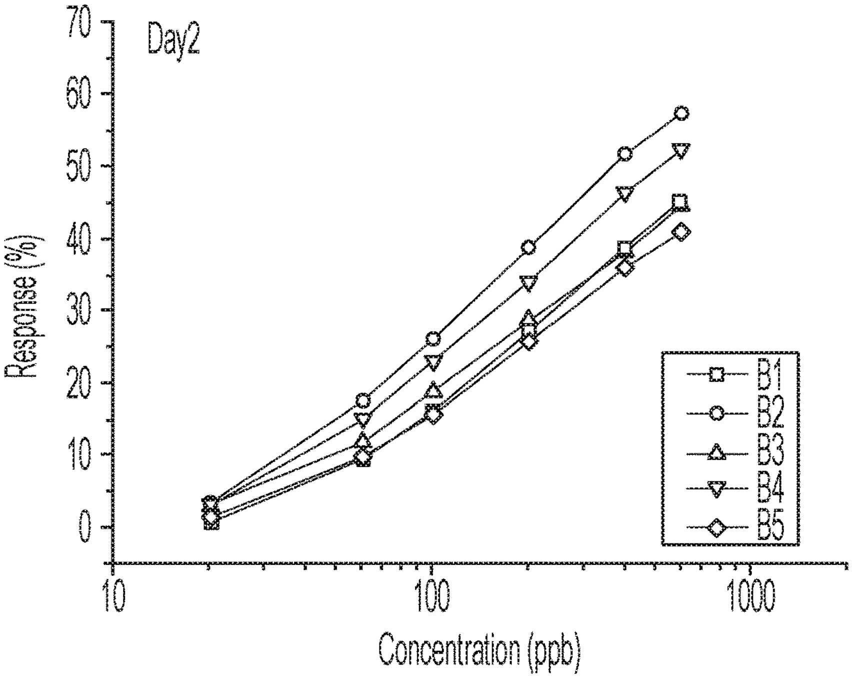

FIGS. 8A and 8B illustrate sensor response as a function of ammonia concentration for samples A1-A5 (FIG. 8A) and samples B1-B5 (FIG. 8B). The x-axis is in logarithm scale. Mixed polymer samples (A3-A5 and B3-B5) deliver similar sensitivities as pure polymer samples (A1, A2, B1, and B2). Thus, based on FIGS. 7A-8B, it is shown that mixed polymer active layers in sensors described herein may enhance output current without degrading sensing sensitivity.

The invention claimed is:

1. An electronic sensing device comprising:

a substrate;

a cathode disposed on the substrate;

an anode positively biased relative to the cathode;

an insulating layer disposed between the cathode and the anode; and a semiconductor layer comprising an organic semiconductor polymer with the structure:

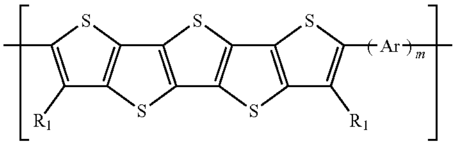

or

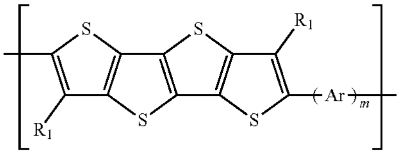

wherein each x is independently $NR_5$, S, Se, or O; each $R_1$ is independently hydrogen, halogen, $C_1$-$C_{40}$ alkyl, $C_1$-$C_{40}$ alkenyl, $C_1$-$C_{40}$ alkynl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted with $C_1$-$C_{20}$ alkyl, $C_1$-$C_{20}$ alkenyl, $C_1$-$C_{20}$ alkynyl, $C_3$-$C_{20}$ cycloalkyl, halogen, hydroxy, $C_6$-$C_{20}$ aryl, $C_6$-$C_{20}$ heteroaryl, alkoxy, carboxy, carboxylic acid, cyano, or heterocyclyl; each $R_5$ is independently hydrogen or $C_1$-$C_{40}$ alkyl which may be optionally substituted with $C_1$-$C_{20}$ alkyl; m is an integer from 1 to 10; n is an integer from 2 to 10,000; and each Ar is independently an optionally substituted conjugated group, an optionally substituted aryl group, or an optionally substituted heteroaryl group;

wherein the anode is disposed on the insulating layer, and the semiconductor layer contacts the cathode and the anode.

2. The electronic sensing device of claim 1, wherein each Ar is independently one of:

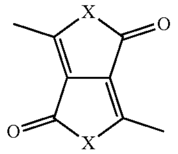

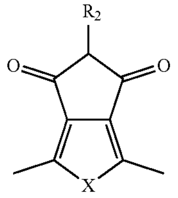

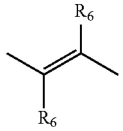

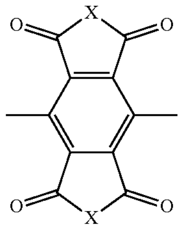

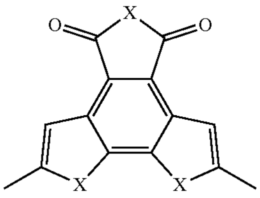

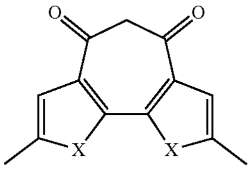

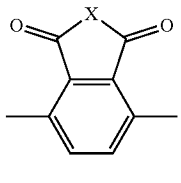

-continued

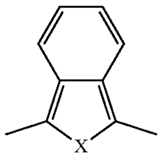

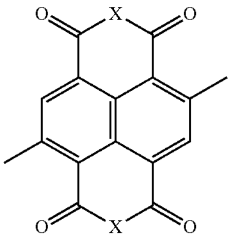

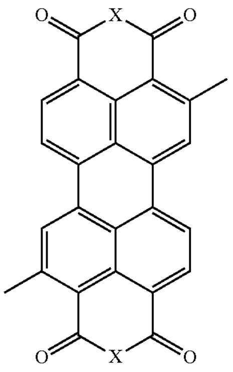

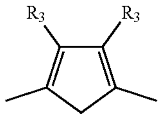

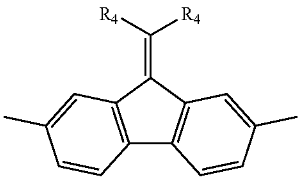

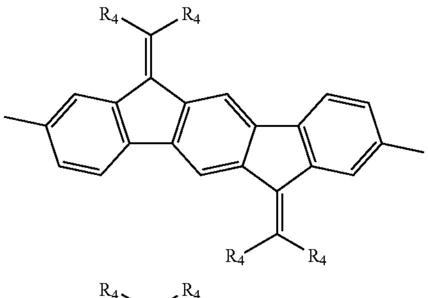

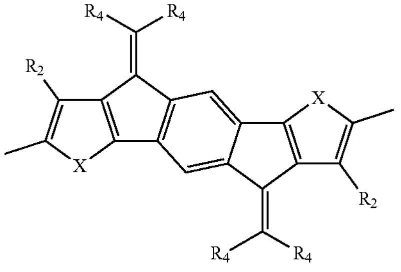

-continued

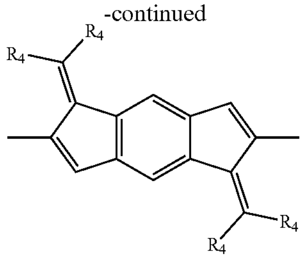

where each x is independently $NR_5$, S, Se, or O; each $R_2$ is independently hydrogen, halogen, $C_1$-$C_{40}$ alkyl, $C_1$-$C_{40}$ alkenyl, $C_1$-$C_{40}$ alkynl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted with $C_1$-$C_{20}$ alkyl, $C_1$-$C_{20}$ alkenyl, $C_1$-$C_{20}$ alkynyl, $C_3$-$C_{20}$ cycloalkyl, halogen, hydroxy, $C_6$-$C_{20}$ aryl, $C_6$-$C_{20}$ heteroaryl, alkoxy, carboxy, carboxylic acid, cyano, or heterocyclyl; each $R_3$ is independently hydrogen, $C_1$-$C_{40}$ alkyl, $C_1$-$C_{40}$ alkenyl, $C_1$-$C_{40}$ alkoxy, $C_1$-$C_{40}$ cycloalkyl, $C_1$-$C_{40}$ aryl, $C_1$-$C_{40}$ heteroaryl, or $C_1$-$C_{40}$ conjugated group, any of which may be optionally substituted with $C_1$-$C_{20}$ alkyl, $C_1$-$C_{20}$ alkenyl, $C_1$-$C_{20}$ alkynyl, $C_3$-$C_{20}$ cycloalkyl, halogen, hydroxy, $C_6$-$C_{20}$ aryl, C6-C20 heteroaryl, alkoxy, carboxy, carboxylic acid, cyano, or heterocyclyl; each $R_4$ is independently hydrogen, C1-C40 alkyl, cyano, ester, or carboxylic acid; and each $R_6$ is independently hydrogen, $C_1$-$C_{40}$ alkyl, cyano, ester, or carboxylic acid.

3. The electronic sensing device of claim 2, wherein one or more of $R_1$, $R_2$, $R_3$, $R_4$, and $R_6$ is a $C_{15}$-$C_{35}$ alkyl, wherein the $C_{15}$-$C_{35}$ alkyl is optionally substituted.

4. The electronic sensing device of claim 3, wherein one or more of $R_1$, $R_2$, $R_3$, and $R_4$ is a $C_{15}$-$C_{35}$ alkyl having at least one branching point, wherein the $C_{15}$-$C_{35}$ alkyl is optionally substituted.

5. The electronic sensing device of claim 4, wherein each $R_1$ or $R_2$ is independently a $C_{15}$-$C_{35}$ alkyl, wherein the $C_{15}$-$C_{35}$ alkyl is optionally substituted.

6. The electronic sensing device of claim 5, wherein each $R_1$ or $R_2$ is independently a $C_{15}$-$C_{35}$ alkyl having at least one branching point, wherein the $C_{15}$-$C_{35}$ alkyl is optionally substituted.

7. The electronic sensing device of claim 6, wherein the at least one branching point of each $R_1$ or $R_2$ is at least 4 carbons from the point of attachment.

8. The electronic sensing device of claim 1, wherein the organic semiconductor polymer has the structure:

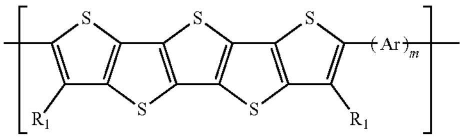

or

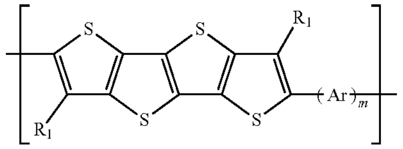

wherein each $R_1$ is independently hydrogen, $C_1$-$C_{40}$ alkyl, $C_1$-$C_{40}$ alkenyl, $C_1$-$C_{40}$ alkynl, $C_1$-$C_{40}$ alkoxy, $C_1$-$C_{40}$ cycloalkyl, $C_1$-$C_{40}$ aryl, $C_1$-$C_{40}$ heteroaryl, $C_1$-$C_{40}$ heterocycloalkyl, $C_1$-$C_{40}$ conjugated group, any of which may be optionally substituted, or halo.

9. The electronic sensing device of claim 1, wherein at least one Ar is:

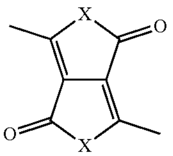

where each x is independently $NR_5$, S, Se, or O; each $R_5$ is independently hydrogen, $C_1$-$C_{40}$ alkyl.

10. The electronic sensing device of claim 1, wherein m is 1 and Ar is:

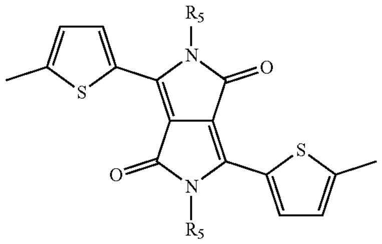

or

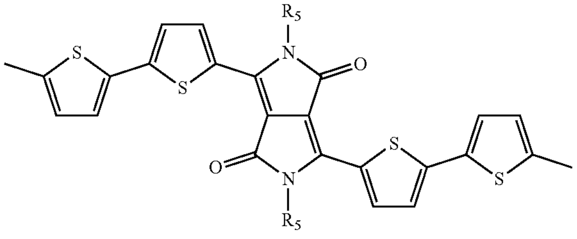

wherein each $R_5$ is independently hydrogen or $C_1$-$C_{40}$ alkyl.

11. The electronic sensing device of claim 1, wherein the electronic sensing device has an operating voltage of 2 V or less.

12. The electronic sensing device of claim 1, wherein the electronic sensing device has an output current density from about 80 $mA/cm^2$ to about 160 $mA/cm^2$.

13. The electronic sensing device of claim 1, wherein the electronic sensing device is capable of detecting ammonia at 2 ppb.

14. The electronic sensing device of claim 1, wherein the electronic sensing device exhibits ammonia sensing activity after the electronic sensing device has been exposed to ambient conditions for 21 days.

15. The electronic sensing device of claim 1, further comprising vertical channels penetrating through the anode and the insulating layer, wherein at least a portion of the semiconducting layer is disposed in the vertical channels.

16. A method of detecting airborne molecules, the method comprising:

applying an electric potential to create an electrical current in the electronic sensing device of claim 1;

measuring a signal based on changes in the electrical current in the electronic sensing device; and outputting the signal.

17. The method of claim 16, wherein the changes in the electrical current in the electronic sensing device are based on adhesion of the airborne molecules having a concentration to the organic semiconductor polymer.

18. The method of claim 17, wherein the concentration of the airborne molecules is from 1 ppb to 500 ppm.

19. The method of claim 16, wherein the measuring a signal is an integrated measurement over a time of 1 minute or less.

20. The method of claim 16, wherein the airborne molecules comprise at least one amine group.

* * * * *